(12) United States Patent
Gyun

(10) Patent No.: US 7,598,542 B2
(45) Date of Patent: Oct. 6, 2009

(54) SRAM DEVICES AND METHODS OF FABRICATING THE SAME

(75) Inventor: Ahn Heui Gyun, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 299 days.

(21) Appl. No.: 11/027,077

(22) Filed: Dec. 29, 2004

(65) Prior Publication Data

US 2005/0141268 A1   Jun. 30, 2005

(30) Foreign Application Priority Data

Dec. 31, 2003   (KR) .................... 10-2003-0101390

(51) Int. Cl.
*H01L 27/11*   (2006.01)
*H01L 21/8244*   (2006.01)

(52) U.S. Cl. .............. 257/206; 257/903; 257/E21.661; 257/E27.099; 438/199

(58) Field of Classification Search ............... 257/903, 257/E21.661, E27.098, 206, 379, 380, 381, 257/904, E27.099, E27.1, E27.101; 438/199
See application file for complete search history.

(56) References Cited

U.S. PATENT DOCUMENTS

| | | | | |
|---|---|---|---|---|
| 4,939,567 A * | 7/1990 | Kenney | ...................... | 257/383 |
| 6,015,996 A * | 1/2000 | Lee | ............................. | 257/393 |
| 6,090,673 A * | 7/2000 | Allen et al. | .................. | 438/301 |
| 6,255,701 B1 * | 7/2001 | Shimada | ..................... | 257/384 |
| 6,313,510 B1 * | 11/2001 | Kim et al. | ................... | 257/382 |
| 7,087,493 B1 * | 8/2006 | Madan | ....................... | 438/284 |

* cited by examiner

*Primary Examiner*—Richard Elms
*Assistant Examiner*—Michael Lulis
(74) *Attorney, Agent, or Firm*—The Law Offices of Andrew D. Fortney; Andrew D. Fortney

(57) ABSTRACT

SRAM devices and methods of fabricating the same are disclosed, by which a process margin and a degree of device integration are enhanced by reducing the number of contact holes of an SRAM device unit cell using local interconnections. A disclosed example device includes first and second load elements; first and second drive transistors; a common gate electrode connected in one body to a gate electrode of the first load element and a gate electrode of the first drive transistor to apply a sync signal to the gate electrodes; the common gate electrode overlapping with a junction layer of the second load element and a junction layer region of the second drive transistor; the common gate electrode being electrically connected to an upper line via a plug in one contact hole.

20 Claims, 7 Drawing Sheets

SRAM DEVICES AND METHODS OF FABRICATING THE SAME

FIELD OF THE DISCLOSURE

The present disclosure relates to SRAM devices and methods of fabricating the same, by which a process margin and degree of device integration are enhanced by reducing the number of contact holes of an SRAM device unit cell using local interconnection.

BACKGROUND

Generally, a unit cell of a static random access memory (hereinafter abbreviated "SRAM") includes six transistors (6-Tr). More specifically, a unit cell typically includes two drive transistors, two access transistors, and two load elements.

A circuit and layout of a prior art 6-Tr SRAM unit cell will now be explained. FIG. 1 is a circuit diagram of the prior art SRAM device unit cell. FIG. 2 is a layout of the prior art SRAM device unit cell.

Referring to FIG. 1 and FIG. 2, the SRAM device unit cell includes access transistors Q1 (250) and Q3 (260) having gates connected to a wordline WL and drains connected to positive and negative bitlines BL and/BL, respectively. The SRAM device unit cell also includes load elements Q5 (210) and Q6 (220) having their sources connected to a power voltage Vcc. The unit cell also includes a positive cell node N which is commonly connected to a drain of the load element Q5 (210) and to the source of the access transistors Q1 (250). The unit cell also has a negative cell node/N which is commonly connected to a drain of the load element Q6 (220) and to the source of the access transistors Q3 (260). The unit cell is further provided with drive transistors Q2 (230) and Q4 (240). The drive transistor Q2 is connected to the drain of the load element Q5. The drive transistor Q4 is connected to the drain of the load element Q6. The gates of the drive transistors Q2, Q4 are respectively connected to the gates of the load elements Q5, Q6 in a CMOS configuration. Further, the gates of the drive transistors Q2 (230), Q4 (240) are cross-linked to the positive and negative cell nodes N,/N, respectively.

The area enclosed by a dotted-line square in FIG. 2 corresponds to the unit cell of the 6-Tr SRAM device. Each area enclosed by a solid line within the unit cell corresponds to an active area. Moreover, each hatched square indicates a contact hole 206.

Referring to FIG. 2, a common gate electrode 271 is provided to apply a sync signal to the gates of the load element 210 and the drive transistor 230. Upper metal lines (not shown in the drawing) are formed on an insulating inter layer covering the six transistors. Contact holes are formed in the insulating interlayer to connect the six transistors to the upper metal lines. Each of the contact holes 206 is filled with a conductive plug. In the unit cell of the SRAM device shown in FIG. 2, eight and half (8.5) contact holes are formed for the connections between the transistors and the metal lines.

Specifically, the 8.5 contact holes include 6.5 contact holes for connections to the junctions (source/drain) of the transistors and 2 contact holes for connection to the common gate electrodes of the transistors.

As the design rule is reduced due to the greatly increasing degree of integration in a semiconductor device, the unit cell area or size of the SRAM device is reduced as well. However, the unit cell of the 6-Tr SRAM device requires the 8.5 contact holes which occupy a considerable fixed area within the unit cell.

To keep up with the rapidly increasing degree of integration of the SRAM device, the number of contact holes required for the unit cell of the SRAM device must be lowered as the design rule is reduced.

A prior art method of reducing the number of the contact holes in the unit cell of the SRAM device will now be explained with reference to FIG. 3. FIG. 3 is a cross-sectional view of the SRAM device unit cell in FIG. 2 taken along cutting line A-A'.

Referring to FIG. 3, a field oxide layer 202 is provided in a field area to define an active area of a semiconductor substrate 201. Gate electrodes 203, 204 of a drive transistor and a load element are formed in the active areas of the substrate 201. Sources S and drains D are provided to on opposite sides of the gate electrodes 203, 204.

A gate insulating layer (not shown in the drawing) is provided beneath each of the gate electrodes 203, 204. A spacer (not shown in the drawing) may be provided on each sidewall of the gate electrodes 203, 204.

A common gate electrode 271 is formed between the gate electrodes 203, 204 to apply a sync signal to the gate electrodes 203, 204 of the load element and the drive transistor.

An insulating layer 205 is formed on the substrate 201 including the common gate electrode 271. An upper line (not shown in the drawing) is formed on the insulating interlayer 205.

The source/drain S/D and the common gate electrode 271 are electrically connected to the upper line via respective plugs 207. The plugs 207 fill contact holes 206 provided in the insulating interlayer 205. The contact holes 206 are formed by selectively etching the insulating interlayer 205 to expose two junction layers (source or drain) of the two transistors and the common gate electrode 271.

In the unit cell of the illustrated prior art SDRAM device, three contact holes are required for electrical connections between the upper line and the load element, the common gate electrode 271 and the drive transistor.

As shown in FIG. 2, the contact holes provided for the load element, the common gate electrode 271, and the drive transistor are aligned on almost the same line. Since the contact holes are nearly aligned on the same straight line and are densely aggregated, the process margin is lowered due to the reduced design rule.

Moreover, as the number of contact holes required for the unit cell of the SRAM device is fixed at 8.5, it is difficult to increase the degree of integration of the semiconductor device.

BRIEF DESCRIPTION OF THE DRAWINGS

Wherever possible, the same reference numbers will be used throughout the drawings to refer to the same or like parts.

DETAILED DESCRIPTION

Figure 4:
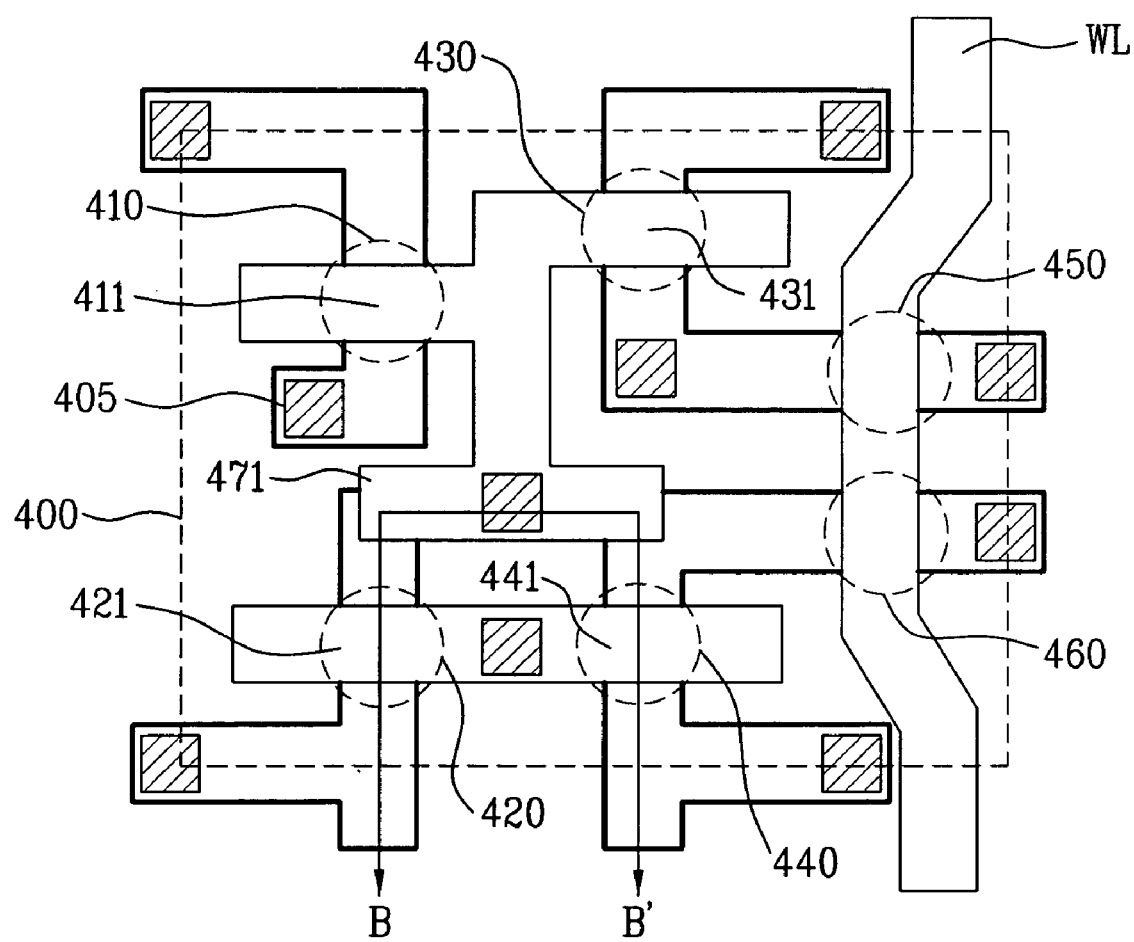
FIG. 4 is a diagram illustrating the layout of an example SRAM device unit cell constructed in accordance with the teachings of the present invention.

FIG. 4 is a diagram illustrating the layout of an example SRAM device unit cell constructed in accordance with the teachings of the present invention. Referring to FIG. 4, an example unit cell of the SRAM device includes six transistors. In particular, it includes a pair of load elements 410, 420, a pair of drive transistors 430, 440, and a pair of access transistors 450, 460 aligned in a row.

In a central area of the unit cell, the load elements 410, 420 and the drive transistors 430, 440 are densely aggregated. The access transistors 450, 460 are provided to one side of the drive transistors 430, 440. The gates of the access transistors 450, 460 are connected to a wordline WL.

The gate electrodes 411, 431 of the first lead element and the first drive transistor are connected in one body. A common gate electrode 471 is provided at one end to transfer a sync signal to the first load element 410 and the first drive transistor 430 upon receiving an electric signal from an upper line (not shown in the drawing). Of course, another common gate electrode (not shown in the drawing) for the second load element 420 and the second drive transistor 440 are provided to another unit cell.

One end of the common gate electrode pattern 471 of the first load element and the first drive transistor is overlapped with active areas, (i.e., source/drain regions), of the second load element 420 and the second drive transistor 440. The common gate electrode pattern 471 can be formed of doped polysilicon.

A plurality of contact holes 405 for enabling electrical connections to upper lines are formed on the active areas and the gates such as the common gate electrodes and the like. The unit cell of the illustrated example SRAM device includes six and half (6.5) contact holes 405. Specifically, there are two contact holes on the gate pattern of the transistors including the common gate electrode 471, and four and one-half contact holes on the junction layers (source/drain regions) of the transistors. Thus, the total number (6.5) of contact holes in the illustrated example SRAM device is smaller than the total number (8.5) of contact holes in the prior art device described above.

Specifically, two contact holes are located on the gate pattern including the common gate electrode in both the example SRAM device of FIG. 4 and the prior art device described above. However, the example SRAM devices of FIG. 4 has four and one-half contact holes on the junction layers of the transistors, whereas the prior art SRAM device described above has six and one-half contact holes.

Figure 1:
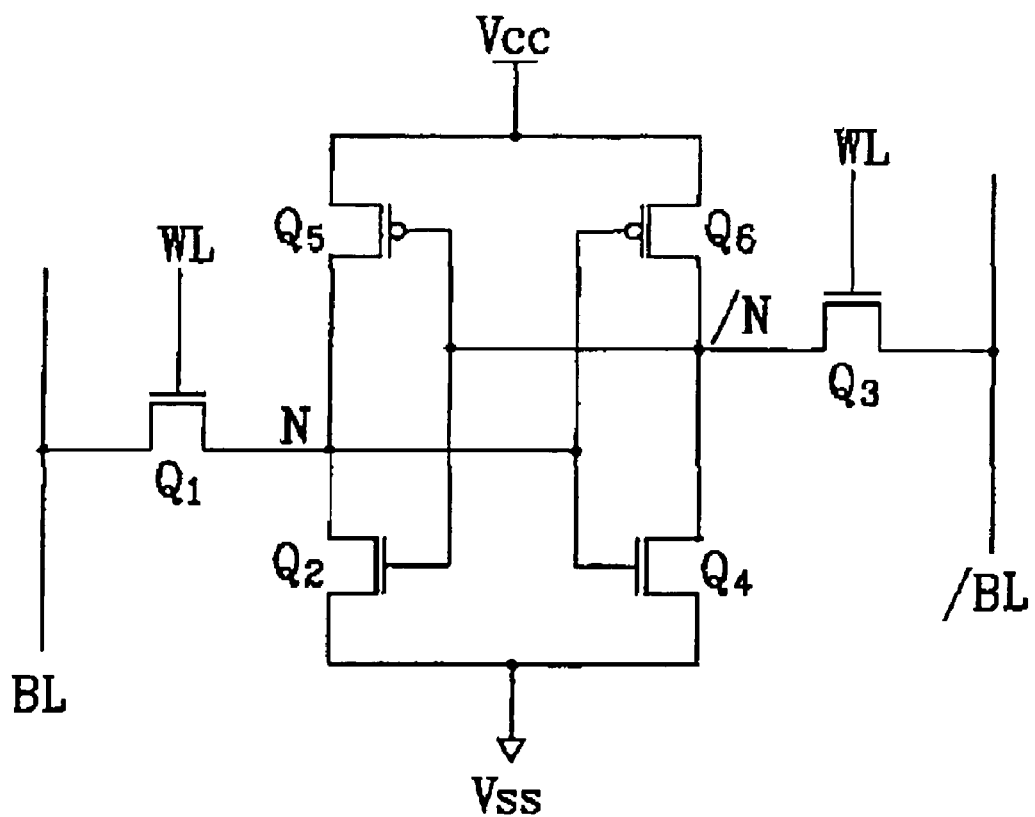
FIG. 1 is a circuit diagram of a prior art SRAM device unit cell.
Figure 2:
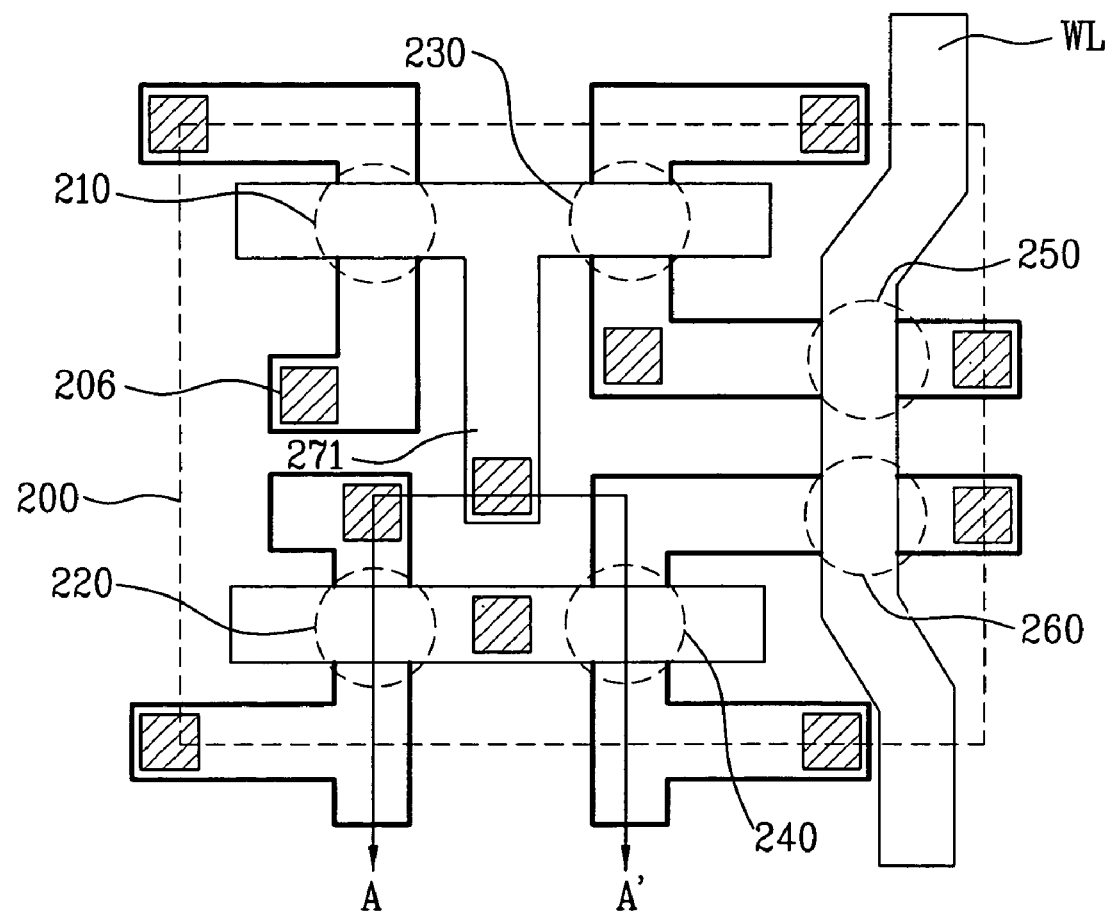
FIG. 2 is a diagram illustrating the layout of the prior art SRAM device unit cell of FIG. 1.
Figure 3:
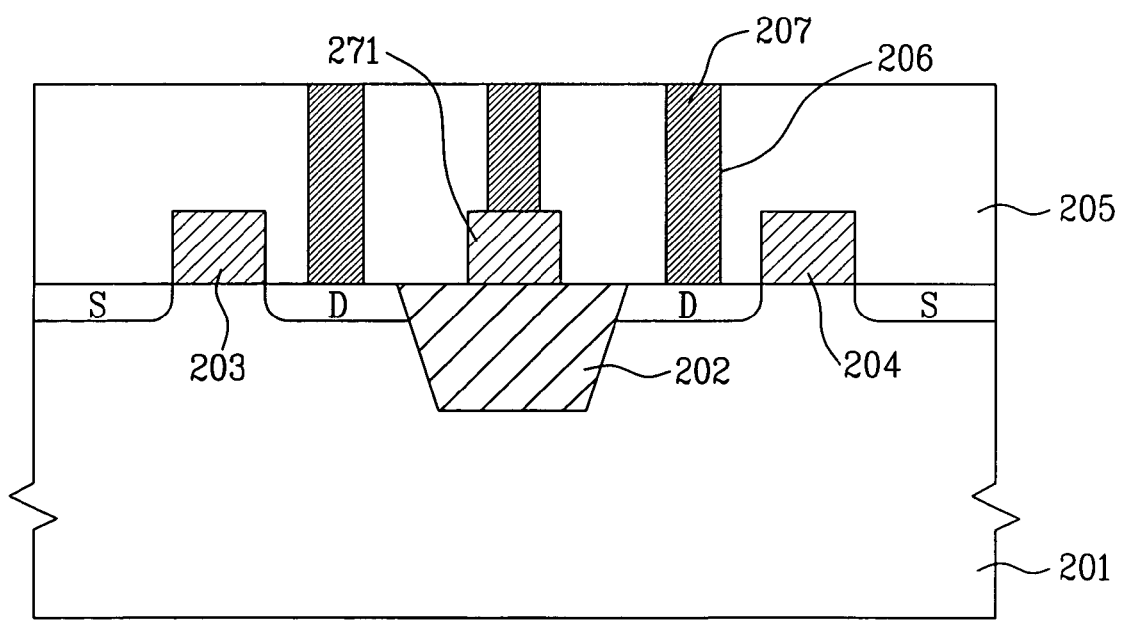
FIG. 3 is a cross-sectional illustration of the SRAM device unit cell of FIG. 2 taken along cutting line A-A' of FIG. 2.

The reason why the number of contact holes on the junction layers in the is reduced by two in the example device of FIG. 4 as compared to the prior art device described in FIGS. 1-3 will now be explained.

First, in the prior art, the contact holes are provided for electrical connections to the upper line of the junction layers of the first load element 210, the common gate electrode 271, and the first drive transistor 230 aligned on the same line. However, in the example device of FIG. 4, one end of the common gate electrode pattern is overlapped with the junction layers of the second load element 420 and the second drive transistor 440. Consequently, one contact hole is formed for the electrical connection to the upper line on one prescribed portion of the common gate electrode pattern. In other words, since the common gate electrode pattern of FIG. 4 overlaps with the second load element and the second drive transistor, only one contact (and, thus, one contact hole) is needed.

Figure 5:
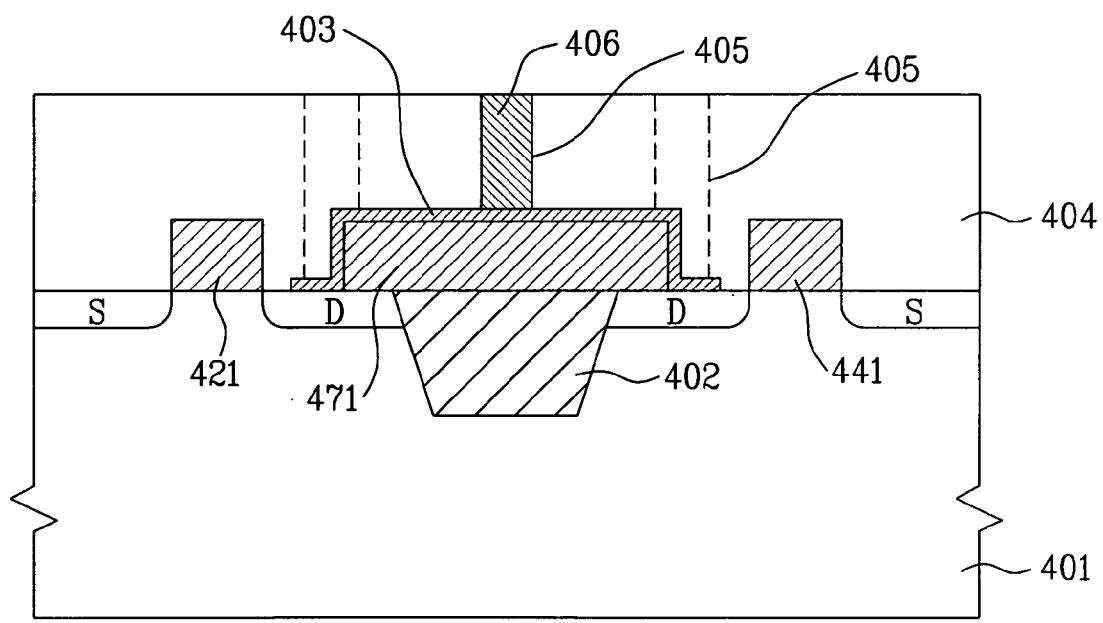
FIG. 5 is a cross-sectional view of the example SRAM device unit cell taken along cutting line B-B' of FIG. 4.

FIG. 5 is a cross-sectional diagram of the example SRAM device unit cell of FIG. 4 taken along cutting line B-B' of FIG. 4. Referring to FIG. 5, a device isolation layer 402 is provided in a field area by STI (shallow trench isolation) or LOCOS (local oxidation of silicon) to define active areas in a semiconductor substrate 401.

Gate electrodes 421, 441 of the second load element and the second drive transistor are respectively formed on the active areas isolated by the device isolation layer 402. Junction layers, (i.e., source/drain regions S/D), are formed in the substrate on opposite sides of the gate electrodes 421, 441.

A common gate electrode pattern 471 is formed on the substrate 401 above the device isolation layer 402 and portions of the junction layers of the second load element and the second drive transistor. The common gate electrode pattern 471 can be formed of doped polysilicon.

A salicide (self-aligned silicide) layer 403 is formed on the common gate electrode pattern 411 and the junction layers D of the second load element and the second drive transistor. In the illustrated example, the salicide layer 403 is formed of Ti-silicide, Co-silicide, Mo-silicide, or the like.

An insulating interlayer 404 is formed on the substrate 401 including on the salicide layer 403.

A contact hole 405 is formed in the insulating interlayer 404 to expose the salicide layer 403. A metal layer fills the contact hole 405 to form a conductive plug 406. An upper line formed, for example, of Al, Cu, or the like, is formed on the insulating interlayer 404 and on the plug 406. The contact hole 405 may be formed on any portion of the salicide layer 403 as long as the salicide layer 403 is exposed.

An example method of fabricating the above-described SRAM device unit cell will now be explained. FIGS. 6A to 6D are cross-sectional views taken along cutting line B-B' in FIG. 4 and illustrate the method of fabricating the SRAM device at various points in time.

Figure 6A:
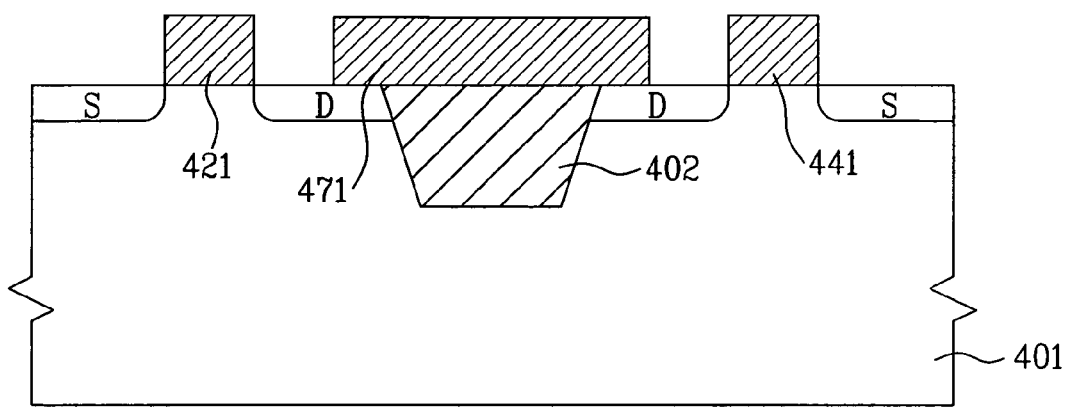
FIGS. 6A to 6D are cross-sectional views illustrating an example method of fabricating an SRAM device performed in accordance with the teachings of the present invention.

Referring to FIG. 6A, a device isolation layer 402 is formed in a field area of the semiconductor substrate 401 by STI (shallow trench isolation) or LOCOS (local oxidation of silicon) to define active areas in the semiconductor substrate 401.

An oxide layer (not shown in the drawing) is grown on the active areas of the semiconductor substrate 401 by thermal oxidation to form a gate oxide layer (not shown in the drawing).

A conductor layer for forming gate electrodes is deposited on the oxide layer. In the illustrated example, the conductor layer is formed of heavily doped polysilicon.

The conductor layer and the oxide layer are selectively patterned to form a gate electrode 421 of a second load element, a common gate electrode 471, and a gate electrode 441 of a second drive transistor.

Figure 6B:
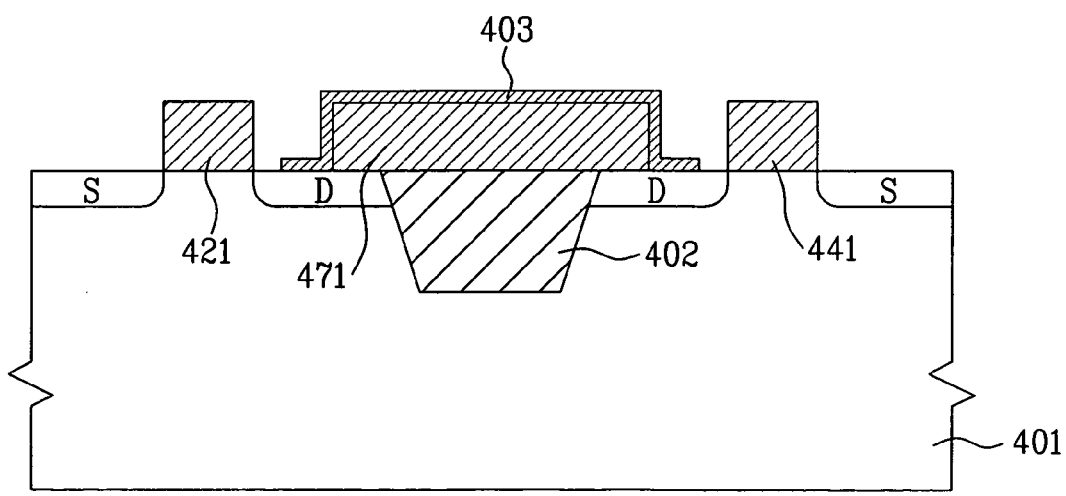

Referring to FIG. 6B, heavy ion implantation is performed on the substrate 401. Annealing is then performed on the substrate 401 to form junction layers, (i.e., sources S and drains D) in the active areas on opposite sides of the gate electrodes 421, 441.

Spacers may be formed on the sidewalls of the gate electrodes 421, 441 prior to forming the sources S and drains D. Further, LDD (lightly doped drain) regions can be formed in the active areas on opposite sides of the gate electrodes 421, 441 by light ion implantation.

After forming the junction layers (i.e., sources and drains), a low specific-resistance, high-melting-point metal layer is formed on the illustrated substrate 401 and on the gate electrode pattern 471 using Ti, Co, Ni, or the like.

Subsequently, annealing is performed on the substrate in an ambience of inert gas such as $N_2$, He, or Ar by RTP (rapid thermal processing) or using a furnace. Accordingly, the high-melting-point metal layer on the gate electrodes and junction layers reacts with the silicon of the semiconductor substrate and the gate electrodes to turn into a silicide layer. In the illustrated example, the portions of the high-melting-point metal layer which fail to react with silicon are removed. After those portions of the high-melting-point metal layer have been removed, a salicide layer 403 is formed.

Alternatively, as shown in FIG. 6B, the salicide layer 403, can be selectively formed on only the common gate electrode pattern 471 and the junction layers.

Figure 6C:
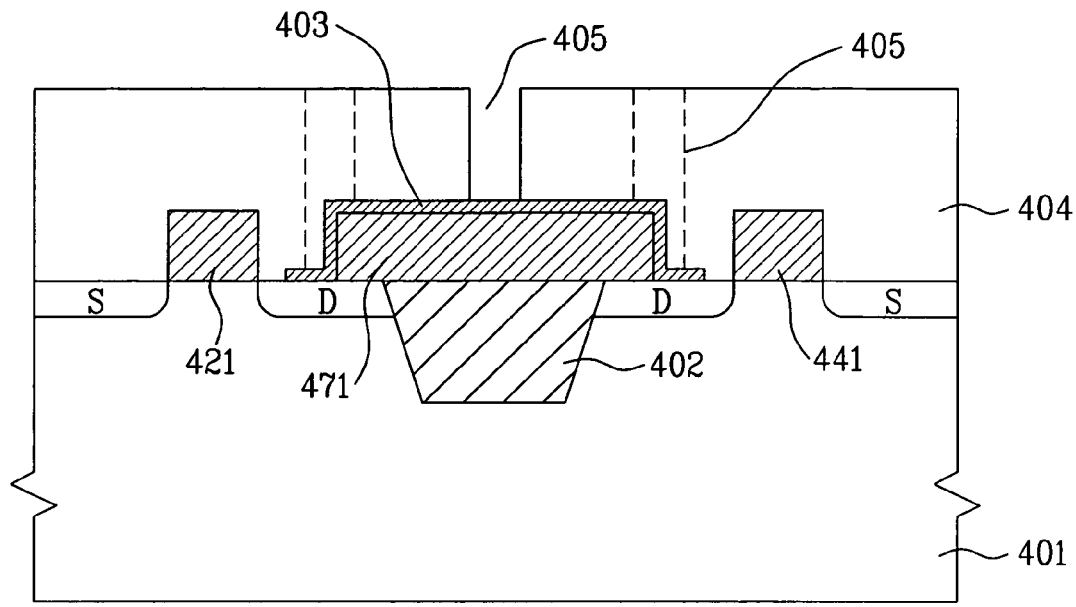

Referring to FIG. 6C, an insulating interlayer 404 is formed on the substrate 401 and on the salicide layer 403. In the illustrated example, the insulating interlayer 404 is formed of oxide such as BPSG (borophosphorous silicate glass) or the like.

A prescribed portion of the insulating interlayer 404 is then etched to form a contact hole 405. In the illustrated example, the contact hole 405 is formed to expose a portion of the salicide layer 403. Dotted lines in the drawing indicate alternate contact holes 405 that can be formed on the salicide layer 403.

Figure 6D:
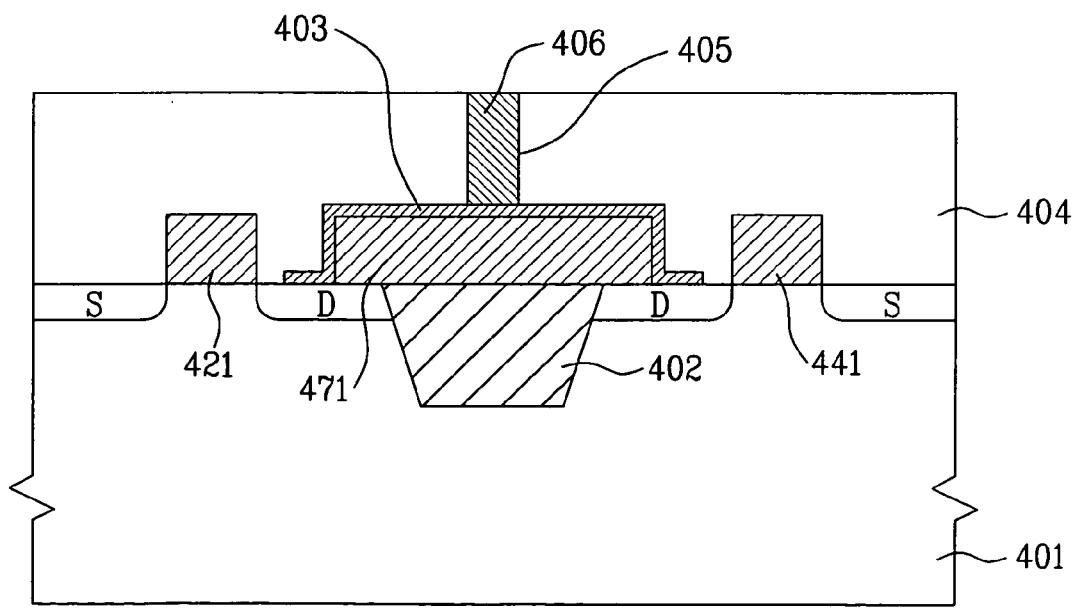

Referring to FIG. 6D, the contact hole 405 is filled with a conductor metal layer to form a conductive plug 406.

Subsequently, an upper line (not shown in the drawing) is formed on the insulating interlayer 404 in contact with the plug 406.

Alternatively, the plug 406 and the upper line can be formed by a damascene process.

In the above-described SRAM device, the common gate electrode pattern 471 is formed on the area including: (a) the junction layer of the second load element and (b) the junction layer of the second drive transistor, and the salicide layer 403 is formed on the common gate electrode 471 and the corresponding junction layers.

The contact hole 405 exposing a portion of the salicide layer 403 can function as the contact holes for the junction layer of the second load element, for the junction layer of the second drive transistor, and for the common gate electrode of the prior art. Therefore, the example device of FIG. 6D employs only one contact hole instead of the three contact holes in the prior art. As a result, the above disclosed method can achieve a simplified process and a device size reduction by providing one contact hole for electrical connections with an upper line of a load element, a drive transistor, and a common gate electrode.

From the foregoing, persons of ordinary skill in the art will appreciate that SRAM devices and methods of fabricating the same have been disclosed, in which a process margin and the high degree of device integration are enhanced by reducing the number of contact holes in the SRAM device unit cell using local interconnections.

A disclosed example SRAM device includes first and second load elements; first and second drive transistors; a common gate electrode connected in one body to a gate electrode of the first load element and a gate electrode of the first drive transistor to apply a sync signal to the gate electrodes, the common gate electrode being overlapped with a junction layer of the second load element and a junction layer region of the second drive transistor, the common gate electrode being electrically connected to an upper line via one contact hole filled with a plug.

Preferably, the SRAM device further includes a silicide layer on the junction layer of the second load element, the junction layer region of the second drive transistor, and the common gate electrode.

More preferably, the contact hole is formed to expose a portion of the silicide layer.

A disclosed example method of fabricating an SRAM device having first and second load elements and first and second drive transistors, comprises: forming a device isolation layer on a semiconductor substrate to define active areas therein; forming gate electrodes of the second load element and the second drive transistor on the active areas isolated by the device isolation layer; forming a common gate electrode of the first load element and the first drive transistor on prescribed portions of the active areas and the device isolation layer; forming source/drain regions on opposite sides of each of the gate electrodes of the second load element and the second drive transistor; forming an insulating interlayer on the substrate including the gate electrodes and the common gate electrode; forming a contact hole in the insulating interlayer to expose a portion of the common gate electrode, and forming a plug filing the contact hole.

Preferably, the method further includes forming a silicide layer on the source/drain regions and the common gate electrode prior to forming the insulating layer.

Preferably, the contact hole is formed to expose a portion of the silicide layer.

A disclosed example SRAM device includes a semiconductor substrate having active areas defined by a device isolation layer; gate electrodes of a second load element and a second drive transistor on the active areas isolated by the device isolation layer; a common gate electrode of a first load element and a first drive transistor on portions of the active areas and the device isolation layer; source/drain regions on opposite sides of the gate electrodes of the second load element and the second drive transistor; an insulating interlayer on the gate electrodes and the common gate electrode; a contact hole in the insulating interlayer to expose a portion of the common gate electrode, and a plug in the contact hole.

Preferably, the SRAM device further includes a silicide layer on the source/drain regions and the common gate electrode.

Preferably, the contact hole is formed to expose a portion of the silicide layer.

From the foregoing, persons of ordinary skill in the art will readily appreciate that the disclosed methods achieve a simplified process and a device size reduction by providing one contact hole for electrical connections with an upper line of a load element, a drive transistor, and a common gate electrode.

It is noted that this patent claims priority from Korean Patent Application Serial Number P2003-0101390, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An SRAM device, comprising:
    first and second load elements, the second load element having a junction layer;
    first and second drive transistors, the second drive transistor having a junction layer region;
    a common gate electrode connected to a gate electrode of the first load element and a gate electrode of the first drive transistor, the common gate electrode on an isolation layer having an uniform upper surface planar with upper surfaces of the junction layer and the junction layer region and in contact with the junction layer of the second load element and the junction layer region of the second drive transistor;

a silicide layer on the junction layer of the second load element, on the junction layer region of the second drive transistor, and on the common gate electrode; and an upper line electrically connected to the common gate electrode via only one contact plug in a contact hole that exposes a portion only of the common gate electrode.

2. An SRAM device as defined in claim 1, wherein the contact hole exposes a portion only of the silicide layer on the common gate electrode.

3. An SRAM device as defined in claim 1, wherein the isolation layer comprises a shallow trench isolation (STI) layer or a local oxidation of silicon (LOCOS) layer.

4. An SRAM device as defined in claim 1, wherein the silicide layer is self-aligned (salicide).

5. An SRAM device as defined in claim 4, wherein the salicide layer comprises a Ti, Cu, Ni or Mo salicide.

6. An SRAM device as defined in claim 1, wherein the upper line comprises one or more materials selected from Al, Cu or an alloy thereof.

7. An SRAM device as defined in claim 1, further comprising a borophosphorous silicate glass (BPSG) layer between the silicide layer and the upper line.

8. A method of fabricating an SRAM device having first and second load elements and first and second drive transistors, comprising:

forming a device isolation layer having a uniform upper surface in a semiconductor substrate to define first, second, third and fourth active areas therein;

forming gate electrodes of the second load element and the second drive transistor on the second and fourth active areas;

forming a common gate electrode of the first load element and the first drive transistor on the first and third active areas and on the device isolation area and portions of the second and fourth active areas planar with the upper surface of and adjacent to the device isolation area;

forming source/drain regions on opposite sides of the gate electrodes of the second load element and the second drive transistor;

forming a silicide layer on the source/drain regions and on the common gate electrode prior to forming the insulating layer;

after forming the silicide layer, forming an insulating interlayer on the gate electrodes and the common gate electrode;

forming a contact hole in the insulating interlayer to expose a portion only of the common gate electrode; and forming a plug in the contact hole.

9. A method as defined in claim 8, wherein the contact hole exposes at least a portion only of the silicide layer on the common gate electrode.

10. A method as defined in claim 8, wherein the device isolation layer is formed by shallow trench isolation (STI) or local oxidation of silicon (LOCOS).

11. A method as defined in claim 8, wherein forming the gate electrodes and the common gate electrode comprises:

growing a gate oxide layer on the active areas by thermal oxidation;

depositing a single conductor layer comprising doped polysilicon on the gate oxide layer; and selectively patterning the gate oxide layer and the conductor layer.

12. A method as defined in claim 8, further comprising:

forming spacers on sidewalls of the gate electrodes of the second load element and the second drive transistor prior to forming the source/drain regions; and forming lightly doped drain (LDD) regions on opposite sides of the gate electrodes of the second load element and the second drive transistor.

13. A method as defined in claim 8, wherein forming the silicide layer further comprises:

forming a high-melting point metal layer comprising one or more materials selected from Ti, Cu, Ni and Mo on the common gate electrode and the source/drain regions; and annealing the metal layer by rapid thermal processing (RTP) or furnace annealing.

14. An SRAM device, comprising:

first and second load elements;

first and second drive transistors;

a semiconductor substrate having first, second, third and fourth active areas defined by a device isolation layer having a uniform upper surface planar with upper surfaces of the active areas;

gate electrodes of the second load element and the second drive transistor on the second and fourth active areas;

a common gate electrode on the device isolation layer of the first load element and the first drive transistor in contact with the second and fourth active areas and the device isolation layer;

a silicide layer on the source/drain regions and the common gate electrode;

an insulating interlayer on the gate electrodes and the common gate electrode;

a contact hole in the insulating interlayer to expose a portion only of the common gate electrode; and a plug in the contact hole.

15. An SRAM device of claim 14, wherein the contact hole exposes a portion only of the silicide layer on the common gate electrode.

16. An SRAM device as defined in claim 14, further comprising a shallow trench isolation (STI) layer or a local oxidation of silicon (LOCOS) layer.

17. An SRAM device as defined in claim 14, wherein the silicide layer is self-aligned (salicide).

18. An SRAM device as defined in claim 17, wherein the salicide layer comprises a Ti, Cu, Ni or Mo salicide.

19. An SRAM device as defined in claim 14, wherein the upper line comprises one or more materials selected from Al, Cu or an alloy thereof.

20. An SRAM device as defined in claim 14, further comprising a borophosphorous silicate glass (BPSG) layer between the silicide layer and the upper line.

* * * * *